United States Patent
Asada et al.

(10) Patent No.: US 9,221,130 B2
(45) Date of Patent: *Dec. 29, 2015

(54) MATERIAL FOR THERMAL BONDING, COATING MATERIAL FOR THERMAL BONDING, COATING, AND ELECTRONIC COMPONENT BONDING METHOD

(75) Inventors: Toshiaki Asada, Tokyo (JP); Hidemichi Fujiwara, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 149 days.

This patent is subject to a terminal disclaimer.

(21) Appl. No.: 13/993,457

(22) PCT Filed: Dec. 15, 2011

(86) PCT No.: PCT/JP2011/007021
§ 371 (c)(1),
(2), (4) Date: Jun. 12, 2013

(87) PCT Pub. No.: WO2012/081255
PCT Pub. Date: Jun. 21, 2012

(65) Prior Publication Data
US 2013/0266796 A1    Oct. 10, 2013

(30) Foreign Application Priority Data
Dec. 17, 2010   (JP) ................. 2010-281673

(51) Int. Cl.
| | |
|---|---|
| B32B 5/16 | (2006.01) |
| B23K 35/12 | (2006.01) |
| B23K 35/24 | (2006.01) |
| B23K 35/02 | (2006.01) |
| B23K 35/36 | (2006.01) |
| H01B 1/22 | (2006.01) |
| H01L 23/00 | (2006.01) |
| H05K 3/32 | (2006.01) |
| B22F 1/00 | (2006.01) |
| B22F 7/08 | (2006.01) |
| B23K 1/20 | (2006.01) |
| C09J 5/06 | (2006.01) |
| C09J 9/02 | (2006.01) |
| C09J 11/04 | (2006.01) |
| B23K 20/02 | (2006.01) |
| B23K 20/233 | (2006.01) |
| B82Y 30/00 | (2011.01) |
| C08K 3/08 | (2006.01) |
| C08K 7/00 | (2006.01) |
| C08K 5/053 | (2006.01) |

(52) U.S. Cl.
CPC ............. *B23K 35/24* (2013.01); *B22F 1/0022* (2013.01); *B22F 1/0074* (2013.01); *B22F 7/08* (2013.01); *B23K 1/20* (2013.01); *B23K 20/023* (2013.01); *B23K 20/233* (2013.01); *B23K 20/2333* (2013.01); *B23K 35/025* (2013.01); *B23K 35/0222* (2013.01); *B23K 35/3612* (2013.01); *B82Y 30/00* (2013.01); *C09J 5/06* (2013.01); *C09J 9/02* (2013.01); *C09J 11/04* (2013.01); *H01B 1/22* (2013.01); *H01L 24/29* (2013.01); *H05K 3/321* (2013.01); *B23K 2201/38* (2013.01); *B23K 2201/40* (2013.01); *B23K 2203/10* (2013.01); *B23K 2203/18* (2013.01); *C08K 3/08* (2013.01); *C08K 5/053* (2013.01); *C08K 7/00* (2013.01); *C09J 2203/326* (2013.01); *C09J 2400/123* (2013.01); *C09J 2400/163* (2013.01); *H01L 24/83* (2013.01); *H01L 2224/293* (2013.01); *H01L 2224/2929* (2013.01); *H01L 2224/8384* (2013.01); *H01L 2924/01006* (2013.01); *H01L 2924/01029* (2013.01); *H01L 2924/10253* (2013.01); *H05K 2203/1131* (2013.01); *Y10T 428/25* (2015.01)

(58) Field of Classification Search
None
See application file for complete search history.

(56) References Cited

U.S. PATENT DOCUMENTS

| | | | |
|---|---|---|---|
| 5,655,209 A * | 8/1997 | Casey et al. ................ | 419/10 |
| 2005/0194577 A1* | 9/2005 | Kasuga et al. ............... | 252/514 |
| 2008/0014359 A1* | 1/2008 | Kamada et al. ............. | 427/383.1 |
| 2009/0148676 A1 | 6/2009 | Toyoda | |
| 2010/0009153 A1* | 1/2010 | Yang et al. .................. | 428/220 |
| 2013/0001774 A1* | 1/2013 | Masumori et al. .......... | 257/737 |

FOREIGN PATENT DOCUMENTS

| | | |
|---|---|---|
| JP | 2005-205696 A | 8/2005 |
| JP | 2009-037786 A | 2/2009 |
| JP | 2009-140880 A | 6/2009 |
| JP | 2010-036234 A | 2/2010 |
| JP | 2010-056399 A | 3/2010 |
| JP | 2010-202943 A | 9/2010 |
| WO | 2008/065728 A1 | 6/2008 |

* cited by examiner

*Primary Examiner* — Sheeba Ahmed
(74) *Attorney, Agent, or Firm* — Kubotera & Associates, LLC

(57) ABSTRACT

A material is for thermal bonding by metal fine particle sintering mediated by a metal sintered film, such that shorts do not occur readily between bonded sections, and bonding strength is higher than that achieved by plating or sputtering. The material is obtained by dispersing metal fine particles in an organic compound dispersion medium that melts or softens through heating at a temperature higher than 30° C., and is interposed between metal members, semiconductor members or ceramic members. The material includes 60 wt % or more of the organic compound dispersion medium containing one or more types of a polyol having a melting point or softening point of 30° C. or higher and having two or more hydroxyl groups in the molecule, and 80 wt % or more of the metal fine particles that have an average particle size of primary particles ranging from 5 to 200 nm.

11 Claims, No Drawings

MATERIAL FOR THERMAL BONDING, COATING MATERIAL FOR THERMAL BONDING, COATING, AND ELECTRONIC COMPONENT BONDING METHOD

TECHNICAL FIELD

The present invention relates to the material for thermal bonding, coating material for thermal bonding, coating, and electronic component bonding method, which can be substituted for the paste bonding between the same members or different members selected from metal members, semiconductor members, and ceramics members.

BACKGROUND ART

In case that electronic components are mounted on the substrate, it is generally employed that the paste is applied on the substrate and the electronic components are mounted on the portion thereof, and soldered with a reflow or the like, thus mounted. When the paste-like solder is supplied and applied on a prescribed position of the substrate with a prescribed amount, it is necessary to have such processes as the use of dispenser and screen printing, and the specific apparatus is employed in each of the process in many cases. Furthermore, the solder paste contains a low boiling point of organic solvent so that there is a problem to store the paste itself. Accordingly, the solder paste is stored in a sealed state, or cooled state or the like, as necessary.

For example, the patent document 1 discloses a method of mounting electronic components in which the solder paste is filled in the syringe and attached to the dispenser device, then the paste is applied through the dispenser device, then a LED element is mounted by the mounter, and then the reflow treatment is implemented through heating at a nitrogen gas atmosphere. The patent document 2 discloses a method of soldering electronic components on the substrate in which the solder paste is applied on the soldering portion of the substrate through the screen printing or pre-coating or the like, then electronic component is mounted on the portion with the solder applied, then the preheating to melt the flux is implemented, and then the substrate is heated to a temperature that the solder powder is melted. The patent document 3 discloses the doctor blade method, spin-coating method, spray method, screen printing method, ink jet method or the like as the method of applying Ag paste.

In the patent document 1, the solder paste is mounted or applied between the component to be mounted and the metalized layer, and then treated through the reflow so as to be bonded. However, it is necessary that the solder is practically attached to the dispenser device for patterning the solder for example, and then solder paste is applied through the dispenser device. In addition, it is further necessary to improve the bonding strength, and to reduce the impurities contained in the solder paste.

Although the patent document 2 discloses that the solder powder is approximately spherical, and has a plurality of irregularities across the whole surface, and the mean plane roughness Ra measured with the scanning probe microscope (SPM) of the solder powder is within a range of 18 to 100 nm, in order to avoid the dropping of the solder during the reflow treatment with heat, it is necessary to apply the solder by means of the screen printing or pre-coating or the like for patterning the solder.

In the patent document 3, there is a problem that it is necessary to have such a specific device as the doctor blade method, spin-coating method, spray method, screen printing method, ink jet method or the like for applying electrically conductive paste.

PRIOR ART DOCUMENT

Patent Document

Patent document 1: Japanese Patent Application Publication 2010-56399
Patent document 2: Japanese Patent Application Publication 2010-36234
Patent document 3: Japanese Patent Application Publication 2009-37786

SUMMARY OF THE INVENTION

The Problems to be Solved by the Invention

The present invention is made in view of the above described problems of the prior arts, and the purpose of the invention is to provide a material for thermal bonding, coating material for thermal bonding, coating made from the material for thermal bonding, and electronic component bonding method for bonding the body to be bonded and the other body to be bonded with the use of the above, in which it is not necessary to form the mask during the patterning on the surface of the body to be bonded, there is fewer residue of the impurities in comparison with the solder, the short circuit between the bonded portions through migration is hardly occurred, and the bonding strength is higher than that of solder or spattering.

Means to Solve the Problems

The inventors have founded in view of the above prior arts that, when a material for thermal bonding in which the metal fine particles are dispersed in the organic compound dispersion medium containing polyol as the main ingredient which is solid state at a normal temperature (a temperature more than 25 degrees C. and less than 30 degrees C., hereinafter referred to the same meaning) is used in place of the solder paste bonding between the same members, or different members selected from metal members, semiconductor members, or ceramics members, the storage thereof becomes easy, and the patterning becomes easy without using specific apparatus in each of the process, thus the invention is completed. The summary of the present invention is shown as described in the followings (1) to (13).

(1) A material for thermal bonding for bonding between same members or different members selected from metal members, semiconductor members, and ceramics members, in which metal fine particles (P) are dispersed in an organic compound dispersion medium (A), melted or softened through heating at a temperature higher than 30 degrees C., wherein 60 mass % or more of the organic compound dispersion medium (A) comprises one, two or more types of a polyol (A1) having a melting point or softening point of 30 degrees C. or higher and having two or more hydroxyl groups in the molecule; and the metal fine particles (P) have sinterability and 80 mass % or more of the metal fine particles (P) comprise metal particles (P1) that have a mean particle diameter of primary particle within a range from 5 to 200 nm (hereinafter referred to as the first embodiment).

(2) The material for thermal bonding described in the above (1), wherein the metal fine particles (P) comprise the metal fine particles (P1) and metal fine particles (P2) having a mean particle diameter of primary particle within a range from over 200 nm to up to 20 μm.

(3) The material for thermal bonding described in the above (1), wherein the metal fine particles (P) comprise the metal fine particles (P1) and metal fine particles (P2) having a mean particle diameter of primary particle within a range from 1 to 20 μm.

(4) The material for thermal bonding described in any one of the above (1) to (3), wherein the metal fine particles (P) comprise 80 to 95 mass % of the metal fine particles (P1) and 20 to 5 mass % of the metal fine particles (P2) (a total of mass % is 100 mass %).

(5) The material for thermal bonding described in any one of the above (1) to (4), wherein at least the polyol (A1) and one, two or more types of polyol (A2) having a melting point or softening point of below 30 degrees C. and having two or more hydroxyl groups in the molecule are contained in the organic compound dispersion medium (A), a ratio of the polyol (A2) to a total of the polyol (A1) and the polyol (A2) is up to 40 mass %.

(6) The material for thermal bonding described in any one of the above (1) to (5), wherein the material for thermal bonding comprises 10 to 70 mass % of the organic compound dispersion medium (A) and 90 to 30 mass % of the metal fine particles (P) (a total of mass % is 100 mass %).

(7) The material for thermal bonding described in any one of the above (1) to (6), wherein the material for thermal bonding comprises a patterned shaped-matter.

(8) A coating material for thermal bonding described in the above (1), wherein the material for thermal bonding is obtained by heat-melting or softening a material in which the metal fine particles (P) are dispersed in the organic compound dispersion medium (A), or melting or softening the material in which the metal fine particles (P) are dispersed in the organic compound dispersion medium (A) added with an organic solvent or an aquatic solvent (hereinafter referred to as the second embodiment).

(9) A coating obtained by coating the material for thermal bonding described in any one of the above (1) to (6) on a terminal or a surface of an electrode of an electronic component, or a surface of a circuit of a substrate (hereinafter referred to as the third embodiment).

(10) A coating obtained by heating the material for thermal bonding described in any one of the above (1) to (6) at a temperature of 30 degrees C. or higher to melt or soften the organic compound dispersion medium (A), coating the material for thermal bonding on a terminal or a surface of an electrode of an electronic component, or a surface of a circuit of a substrate, and cooling the above to a temperature lower than a melting or softening temperature (hereinafter referred to as the fourth embodiment).

(11) A coating obtained by adding an organic solvent or an aquatic solvent to the material for thermal bonding described in any one of the above (1) to (6) to be melted or softened, coating the material for thermal bonding on a terminal or a surface of an electrode of an electronic component, or a surface of a circuit of a substrate, and causing the solvent to be vaporized, thus solidified (hereinafter referred to as the fifth embodiment).

(12) An electronic component bonding method comprising: heating the material for thermal bonding described in any one of the above (1) to (6) to a temperature in which the organic compound dispersion medium (A) is melted or softened to be patterned on any one of a surface of a body to be bonded (M1) and a surface of another body to be bonded (M2), or on both surfaces thereof; cooling to a temperature lower than a melting or softening temperature to be solidified; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding (hereinafter referred to as the sixth embodiment).

(13) An electronic component bonding method comprising: adding an organic solvent or aquatic solvent to the material for thermal bonding described in any one of the above (1) to (6) to melt or soften the organic compound dispersion medium (A), then patterning on any one of a surface of a body to be bonded (M1) and a surface of another body to be bonded (M2), or on both surfaces thereof; vaporizing the solvent to be solidified; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding (hereinafter referred to as the seventh embodiment).

[14] A electronic component bonding method comprising: placing the patterned shaped matter comprising the material for thermal bonding according to Claim 7 on any one of a surface of a body to be bonded (M1) and a surface of another body to be bonded (M2), wherein the surface comprises at least a metal member, semiconductor member or ceramics material, or on both surfaces thereof; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding.

Effect of the Invention (1) The material for thermal bonding of the first embodiment can be used for bonding of the electronic components mounted on the substrate, or bonding substrates, thus diversifying the material for bonding at the time of mounting. The material for thermal bonding can be used mainly for substituting the solder, and is not paste-like but a solid at a normal temperature, thus it is not necessary to have a specific apparatus (dispenser or printing device) as used in the solder paste or the like. Furthermore, if patterned shaped matters are prepared in advance, it is possible to heat and sinter under the condition in which the shaped matters are mounted on the body to be bonded, and contacted with the other body to be bonded as it is by hand. Since the formation of the pattern of the solder and preheat treatment are not necessary at the time of mounting, the structure of the device used for the bonding of the electronic components can be simplified. In addition, the material for thermal bonding can be supplied together with the electronic components by means of the device (such as chip mounter) mounting the components.

(2) Since the coating material for thermal bonding of the second embodiment is the material in which the metal fine particles (P) are dispersed in the organic compound dispersion medium (A) and is heat melted or softened, or the material in which the organic solvent or aquatic solvent is added to the material and melted or softened, the precursor of the (melted or softened, or melted state or softened state) shaped matter patterned from the coating material for thermal bonding can be obtained. When the precursor of the shaped matter is cooled, or the solvent in the precursor of the shaped matter is vaporized and solidified, the patterned shaped matter can be easily obtained. Since the shaped matter is mounted on the body to be bonded as it is, and contacted with the other body to be bonded, the above can be heated and sintered in that state, thus simplifying the manufacturing processes.

(3) Since the coating for thermal bonding of the third embodiment is heated and sintered to have sintering body having few impurities in comparison with the sintered body obtained by the conventional paste, the bonded body having high bonding strength and high electrical conductivity can be obtained.

In addition, the coating of the fourth embodiment can be easily obtained by heat melting or softening the material for thermal bonding and coating (or applying) on the surface of the terminal or electrode of the electronic component or the surface of the circuit of the substrate in the bonding portion of the electronic component.

In addition, the coating of the fifth embodiment can be easily obtained by adding the organic solvent or aquatic solution to the material for thermal bonding to melt and soften, and coating (or applying) on the surface of the terminal or electrode of the electronic component or the surface of the circuit of the substrate in the bonding portion of the electronic component. Since the coating for thermal bonding of the fourth and fifth embodiments are heated and sintered to have sintering body having few impurities in comparison with the sintered body obtained by the conventional paste, the bonded body having high bonding strength and high electrical conductivity can be obtained.

(4) The electronic component bonding method of the sixth embodiment the bonding method in which the material for thermal bonding described in the first embodiment is heat melted or softened, then patterned (or applied) on the surface of a body to be bonded (M1) and/or a surface of another body to be bonded (M2), then cooled to a temperature lower than a melting or softening temperature to be solidified, and then enabled to heat or burn at a relatively low temperature.

In addition, the electronic component bonding method of the seventh embodiment is the bonding method in which the organic solvent or aquatic solvent is added to the material for thermal bonding described in the first embodiment, and melted or softened, then patterned (or applied) on the surface of a body to be bonded (M1) and/or a surface of another body to be bonded (M2), then the solvent is vaporized and solidified, and then enabled to heat or burn at a relatively low temperature. Since the bonded body obtained by the bonding method of the sixth and seventh embodiments has fine voids therein, the rigidity modulus thereof is low, thus enabling to ease up the stress even though the bonding between the materials having different rate of thermal expansion. Furthermore, when Cu fine particles are used for the metal fine particles (P) for example, the heat transfer is high so that the heat dissipating of the electronic component is improved.

(5) According to the electronic component bonding method of the eighth embodiment, since the patterned shaped matter comprising the material for thermal bonding described in the first embodiment is placed on any one of a surface of a body to be bonded (M1) and a surface of another body to be bonded (M2), wherein the surface comprises at least a metal member, semiconductor member or ceramics material, or on both surfaces thereof, and then the body to be bonded (M1) and the body to be bonded (M2) contacted through the patterned shaped matter are heat treated to bond the body to be bonded (M1) and the body to be bonded (M2) with a sintering body formed from the metal fine particles (P) in the material for thermal bonding, it is not necessary to have a specific apparatus for the patterning, thus enabling to heat and burn at a relatively low temperature. Since there exist fine voids in the bonded body, the rigidity modulus thereof is low, thus enabling to ease up the stress even though the bonding between the materials having different rate of thermal expansion. Furthermore, when Cu fine particles are used for the metal fine particles (P) for example, the heat transfer is high so that the heat dissipating of the electronic component is improved.

DETAILED DESCRIPTION OF EMBODIMENTS

The first embodiment to the eighth embodiment of the invention are described in detail hereunder.

[I] Material for Thermal Bonding of the First Embodiment

The material for thermal bonding of the first embodiment of the invention is a material for thermal bonding for bonding between same members or different members selected from metal members, semiconductor members, and ceramics members, in which metal fine particles (P) are dispersed in an organic compound dispersion medium (A), melted or softened through heating at a temperature higher than 30 degrees C., wherein 60 mass % or more of the organic compound dispersion medium (A) comprises one, two or more types of a polyol (A1) having a melting point or softening point of 30 degrees C. or higher and having two or more hydroxyl groups in the molecule; and the metal fine particles (P) have sinterability and 80 mass % or more of the metal fine particles (P) comprise metal particles (P1) that have a mean particle diameter of primary particle within a range from 5 to 200 nm.

The organic compound dispersion medium (A) and the metal fine particles (P) which form the material for thermal bonding of the invention (hereunder may be described as the material for thermal bonding (F)) are described hereunder. The organic compound dispersion medium (A) is melted or softened, when heated at a temperature of 30 degrees C. or higher, and 60 mass % or more of the organic compound dispersion medium (A) comprises one, two or more types of a polyol (A1) having a melting point or softening point of 30 degrees C. or higher and having two or more hydroxyl groups in the molecule.

(1) Organic Compound Dispersion Medium (A)

A polyol (A1) may comprise only polyol (A1). The Polyol (A) may contain a polyol (A2) in addition to polyol (A1). The organic compound dispersion medium (A) preferably contains lesser resin, more preferably no resin except the contained small amount of polymeric dispersing resin, considering the heat sintering of the metal fine particles (P).

(a) Polyol (A1)

The Polyol (A1) used for the material for thermal bonding (F) is melted at a heating temperature of 30 degrees C. (melting point) or more, and comprises the polyol having two or more hydroxyl groups in the molecule. Polyol (A1) is not limited as far as it has the above described characteristics. For example, the followings are exemplified as the polyol (A1): threitol (melting point of 88 degrees C.), xylitol (melting point of 92 degrees C.), sorbitol (melting point of 95 degrees C.), erythritol (melting point of 121 degrees C.), maltitol (melting point of 145 degrees C.), glucose (melting point of 148 degrees C.), mannitol (melting point of 167 degrees C.), sucrose (melting point of 186 degrees C.), dulcitol (melting point of 187 degrees C.), inositol (melting point of 225 degrees C.), pentaerythritol (melting point of 260 degrees C.), trimethylolpropane (melting point of 56 degrees C.), trimethylolethane (melting point of 193 degrees C.), pyrogallol (melting point of 131 degrees C.), 1,2,3-hexanetriol (melting point of 67 degrees C.), 1,4-cyclohexanediol (melting point of 98 degrees C.), catechol (melting point of 105 degrees C.), or the like. Since the above described polyol has a melting point of higher than a normal temperature, and has reducibility under the melting state, the surface of the metal fine particles (P) is reduced. Furthermore, when heat treated, the polyol (A1) is continuously evaporated so that the sintering of the metal fine particles is facilitated through the reduction and calcinations at the atmosphere of liquid and vaporization of the polyol (A1).

The melting point of the polyol (A1) is preferably at least 30 degrees C. and up to 280 degrees C. Because it is preferable that the bonding by means of the sintering of the metal fine particles (P1) is carried out at a temperature of up to 300 degrees C. Even though the polyol comprises a mixture of two or more types, the mixture can be used for the polyol (A1) when the melting point of the mixture is 30 degrees C. or more.

(b) Polyol (A2)

The organic compound dispersion medium (A) may contain, in addition to the polyol (A1), a polyol (A2) having a melting point of below 30 degrees C. and having two or more hydroxyl groups, in which the amount of the added polyol (A2) is below 40 mass % to a total of the polyol (A1) and the polyol (A2). When the mixture of the polyol (A1) and the polyol (A2) (added amount of the polyol (A2) is up to 40 mass % of the total of the polyol (A1) and the polyol (A2)) maintains the solid state at a normal temperature, the viscosity thereof can be lowered at a time of the heat-melting, thus enabling to perform the reducibility at a lower temperature during the heat sintering. As the polyol (A2), glycerin of triad alcohol (melting point of 17.8 degrees C.), ethylene glycol of divalent alcohol (melting point of −12.9 degrees C.), propylene glycol (melting point of −59.0 degrees C.), diethylene glycol (melting point of −10.45 degrees C.) or the like is listed. The polyol (A2) demonstrates the same function as the polyol (A1) when the metal fine particles (P) are sintered.

(2) Metal Fine Particles (P)

The metal fine particles (P) may comprise only the metal fine particles (P1) having sinterability, and further, the metal fine particles (P) may comprise the metal fine particles (P1) together with the metal fine particles (P2). Since at least one type of highly pure metal fine particles can be used as the metal fine particles (P) used for the material for thermal bonding (F) contrary to the case of the soldering paste, the bonded body excellent in bonding strength and electric conductivity can be obtained. In case of the soldering paste in general, the flux (organic constituent) is contained for the purpose of removing oxidization in a portion of the Cu pad in the substrate as the object to be mounted, and furthermore, small amount of such metals as Al, Zn, Cd, As or the like as impurities contained in the metal material are often contained.

(a) Metal Fine Particles (P1)

The metal fine particles (P1) are not particularly limited as far as the metal fine particles (P1) comprise the metal fine particles having the mean particle diameter of the primary particle within a range of 5 to 200 nm. For example, as the metal fine particles (P1), one or more than two particles selected from the group consisting of Au, Ag, Cu, Pt, Pd, W, Ni, Fe, Co, Ta, Bi, Pb, In, Sn, Zn, Ti, and Al are listed. Among the above metal fine particles, one or more than two particles selected from the group consisting of Ag, Cu, Pt, Pd, W, Ni, Fe, Co, and Ta are preferable, and Cu is more preferable. When the metal fine particles (P1) having at least 5 nm of the mean particle diameter of the primary particle is burned, the porous body having the uniform particle diameter and holes can be formed. On the other hand, when the metal fine particles (P1) having up to 20 nm of the mean particle diameter of the primary particle is burned, the precise electrically conductive pattern can be formed.

(b) Metal Fine Particles (P2)

In the material for thermal bonding (F), in addition to the metal fine particles (P1) having 5 to 200 nm of the mean particle diameter of the primary particle, the metal fine particles (P2) having within a range of from over 200 nm to up to 20 μm, preferably within a range of from 1 to 20 μm of the mean particle diameter of the primary particle can be used as dispersed.

When the metal fine particles (P1) having 5 to 200 nm of the mean particle diameter of the primary particle, and the metal fine particles (P2) having the mean particle diameter of the primary particle within a range of from over 200 nm to up to 20 μm are used as the metal fine particles (P), the metal fine particles (P1) are dispersed between the metal fine particles (P2) and exist stably, as a result, the porous body having the uniform particle diameter and holes can be formed through the heat-burning.

Furthermore, when the metal fine particles (P1) having 5 to 200 nm of the mean particle diameter of the primary particle, and the metal fine particles (P2) having within a range of from 1 to 20 μm are used as the metal fine particles (P), the metal fine particles (P1) are dispersed between the metal fine particles (P2) and exist more stably, as a result, the porous body having the uniform particle diameter and holes can be formed through the heat-burning. When the mean primary particle diameter of the metal fine particles (P2) is within the above described range, the difference between the mean primary particle diameter of the metal fine particles (P2) and the mean primary particle diameter of the metal fine particles (P1) can be secured, so that the free movement of the metal fine particles (P1) can be effectively controlled at the time of the heat treatment, thus improving the dispersibility and stability of the above described metal fine particles. As the metal fine particles (P2), the same particles as described in the metal fine particles (P1) are exemplified.

Here, the mean particle diameter of the primary particle means the diameter of the primary particle of each of the metal fine particles forming secondary particles. The diameter of the primary particle can be measured with the use of the electron microscope. The mean particle diameter means the number average particle diameter of the primary particle. When the metal fine particles (P2) are used together with the metal fine particles (P1) as the metal fine particles (P), the preferable mixing ratio of P1/P2 is within a range of (80 to 95 mass %/20 to 5 mass %) (the total mass % is 100 mass %). With the above mixing ratio, the metal fine particles (P2) can be dispersed without unevenly distributed in the metal bonded body comprising the sintered body which is formed through the heat treatment of the material for thermal bonding (F).

(3) Material for Thermal Bonding (F)

The material for thermal bonding (F) of the invention is a solid material at a normal temperature in which the metal fine particles (P) are dispersed in the organic compound dispersion medium (A) in a solid state at a normal temperature. The material for thermal bonding (F) is placed on a portion to be soldered (between the electrode of the electronic component and the circuit conductor of the substrate or the like), for example, and then when heated within a temperature in which the metal fine particles are sintered, the organic compound dispersion medium (A) is melted to reduce the surface of the metal fine particles and activate, thus facilitating the sintering of the metal fine particles (P) each other. As a result, the electrode and the substrate can be electronically and mechanically bonded in the same manner as the case of using the paste containing nano-sized metal fine particles. Incidentally, the organic compound dispersion medium (A) is removed through decomposing and vaporizing or the like when the material for thermal bonding is heat-sintered.

The mixing ratio (mass ratio) of organic compound dispersion medium (A)/metal fine particles (P) in the material for thermal bonding (F) is preferably within a range from 10/90 to 70/30. With the above mixing ratio, the shape as the solid matter can be maintained, thus enabling to obtain the further stabilized bonding strength.

The method of manufacturing the material for thermal bonding is not specifically limited as far as the material for thermal bonding is in a state in which the metal fine particles (P) are dispersed in the organic compound dispersion medium in a solid state at a normal temperature.

The outer shape of the material for thermal bonding (F) of the invention can be optionally selected in accordance with the purpose of the usage. As a patterned shaped matter, such material for thermal bonding fine piece as a flattened fine piece, scale-like fine piece, tablet-like, particle-like, sheet-like, or lump-like or the like is exemplified. The patterned shaped matter can be placed directly on the surface of the substrate or the like to implement the sintering. In addition, the size thereof is not specifically limited, and can be optionally selected from the maximum diameter of several mm to a chip size used in the electronic component or the like. The above described shaped matter can be formed in such manner that the paste, powder mixture or the like comprising organic compound dispersion medium (A) and the metal fine particles (P) is filled in the mold such as a metal mold, and heated. As a practical example, the paste like matter in which the metal fine particles (P) are mixed in a liquid solution of an organic solvent or aquatic solvent with the organic compound dispersion medium (A) dissolved therein is filled in the metal mold with a plurality of compartments having the shape such as flattened fine piece, scale-like fine piece or the like, and then slowly heated to vaporize the solvent, thus obtaining the material for thermal bonding (F). For example, the paste like matter in which the metal fine particles (P) is mixed in the liquid solution of an organic solvent or aquatic solvent with 25 to 60 mass % of the organic compound dispersion medium (A) dissolved therein is filled in the metal mold separated into a plurality of disintegrable molds, then heated to vaporize the solvent, and then taken out of the mold, thus obtaining the solid material for thermal bonding (F) at a normal temperature. Furthermore, the powder in which the organic compound dispersion medium (A) powder and the metal fine particles (P) are uniformly mixed is placed in the metal mold having a plurality of disintegrable compartments, and then heated, thus obtaining the material for thermal bonding (F). When a patterned shaped matter is used as the material for thermal bonding (F) of the invention, the storage and movement thereof become easy. In addition, it is possible to place the above described shaped matter on the body to be bonded by hand. No specific supply device is necessary when placed on the substrate or the like for the purpose of the usage, thus enabling to simplify.

[II] Coating Material for Thermal Bonding of the Second Embodiment

The coating material for thermal bonding of the second embodiment is the coating material wherein the material for thermal bonding is obtained by heat-melting or softening a material in which the metal fine particles (P) are dispersed in the organic compound dispersion medium (A), or melting or softening the material in which the metal fine particles (P) are dispersed in the organic compound dispersion medium (A) added with an organic solvent or an aquatic solvent.

The coating material in the state of melted or softened, or dissolved or softened is patterned, and then cooled to the solidification so as to obtain the patterned shaped matter, or the solvent of the patterned coating material is vaporized to solidification so as to obtain the patterned shaped matter.

The storage and movement of the shaped matter becomes easy. In addition, it is possible to implement the heat sintering in a state in which the shaped matter placed on the body to be bonded is contacted with other body to be bonded as it is, thus enabling to simplify the process.

[III] Coating of the Third Embodiment

The coating of the third embodiment is a coating obtained by coating the material for thermal bonding (F) described in the first embodiment on a terminal or a surface of an electrode of an electronic component, or a surface of a circuit of a substrate.

The coating of the third embodiment may be a coating obtained by coating the material for thermal bonding (F) described in the first embodiment on a terminal or a surface of an electrode of an electronic component, or a surface of a circuit of a substrate, for example, the method of forming the coating described in the fourth or fifth embodiment described later can be applied, however, not limited to the above methods.

The coating for heat bonding of the third embodiment is heated and sintered, thus obtaining the sintering body with lesser impurities in comparison with the sintering body obtained with the conventional paste, so that the bonded body having high bonding strength and high electrical conductivity can be obtained.

[IV] Coating of the Fourth Embodiment

The coating of the fourth embodiment is a coating obtained by heating the material for thermal bonding described in the first embodiment at a temperature of 30 degrees C. or higher to melt or soften the organic compound dispersion medium (A), coating the material for thermal bonding on a terminal or a surface of an electrode of an electronic component, or a surface of a circuit of a substrate, and cooling the above to a temperature lower than a melting or softening temperature. In case that the material for thermal bonding (F) described in the first embodiment is coated (or applied) on the terminal of the electronic component or the surface of the electrode, or the surface of the circuit of the substrate, the operation becomes remarkably easy when the material for thermal bonding (F) is melted or softened with heating and coated (or applied) on the terminal of the electronic component or the surface of the electrode. The coating for heat bonding is easily obtained in the manner that the material for thermal bonding (F) is melted or softened with heating in advance before the coating (or application) and coated (or applied) on the body to be bonded. As a practical example, the material for thermal bonding (F) in a state of melted or softened with heating is coated or patterned on the face of the body to be bonded such as a silicon tip, and then cooled and solidified, thus obtaining the coating for heat bonding. The method of application or patterning is not specifically limited. The printing such as glue gun, dipping, screening, and the application such as the metal mask application, spraying, brushing, dispensing are listed.

[V] Coating of the Fifth Embodiment

The coating of the fifth embodiment is a coating obtained by adding an organic solvent or an aquatic solvent to the material for thermal bonding (F) described in the first embodiment to be melted or softened, coating the material for thermal bonding on a terminal or a surface of an electrode of an electronic component, or a surface of a circuit of a substrate, and causing the solvent to be vaporized, thus solidified.

By the same manner as described in the fourth embodiment, in case that the material for thermal bonding (F) described in the first embodiment is coated (or applied) on the terminal of the electronic component or the surface of the electrode, or the surface of the circuit of the substrate, the operation becomes remarkably easy when an organic solvent or an aquatic solvent is added to the material for thermal bonding (F) to be melted or softened and coated (or applied) on the terminal of the electronic component or the surface of the electrode.

The coating for heat bonding is easily obtained in the manner that the material for thermal bonding (F) is dissolved in the organic solvent or the aquatic solvent in advance before the coating (or application) and coated (or applied) on the body to be bonded, then the solvent is vaporized to be solidified. As the organic solvent, the lower alcohol (methanol or ethanol) is listed, and as the aquatic solvent, the water is listed, however, not limited to the above.

As a practical example of forming the coating of the fifth embodiment, the material for thermal bonding (F) is dispersed in the organic solvent or aquatic solvent dissolving polyol (A) to form a paste like matter, and coated or patterned on the face of the body to be bonded such as a silicon tip, and then dried, thus obtaining the coating for heat bonding. The method of application or patterning is not specifically limited. As described in the fourth embodiment, the printing such as glue gun, dipping, screening, and the application such as the metal mask application, spraying, brushing, dispensing are listed.

[VI] Electronic Component Bonding Method of Sixth Embodiment

The electronic component bonding method is a method comprising: heating the material for thermal bonding (F) described in the first embodiment to a temperature in which the organic compound dispersion medium (A) is melted or softened to be patterned on any one of a surface of a body to be bonded (M1) and a surface of another body to be bonded (M2), or on both surfaces thereof; cooling to a temperature lower than a melting or softening temperature to be solidified; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding. The material for thermal bonding (F) is patterned, then cooled and solidified. Before or after the body to be bonded (M1) is contacted with the body to be bonded (M2) through the material for thermal bonding (F), it is preferable that the liquid state organic compound (T) having viscosity is applied on the contact face of the above solidified matter in order to stable the contact state so as to prevent the misalignment or the like.

As the application method of the above described liquid state organic compound (T), such means as brushing application, a supplication by the dispenser can be employed. However, those applications are not necessarily implemented on the whole face of the solidified material for thermal bonding, but a part of the application on the surface may be all right if the prevention effect of the misalignment is obtained. According to the employment of the above described fixing means, the bonding between the body (M1) to be bonded and the body (M2) to be bonded can be surely implemented.

As the above described liquid state organic compound (T) having viscosity, there is an organic compound which has a good wet characteristic with all of the material for thermal bonding (F), the body (M1) to be bonded and the body (M2) to be bonded, is a liquid state at a temperature of 25 degrees C., and preferably has a boiling point of about 300 degrees C. without affecting the sintering. As a practical example, ethylene glycol, diethylene glycol, 1,2-propanediol, 1,3-propanediol, 1,2-butanediol, 1,3-butanediol, 1,4-butanediol, 2-buttene-1,4-diol, 1,2,6-hexanetriol, glycerin, 2-methyl-2,4-pentanediol or the like can be listed.

A preferable practical example of the electronic component bonding method of the sixth embodiment is exemplified hereunder, however, the bonding method of the sixth embodiment is not limited to the following practical example.

In case that the body (size 4×4×0.5 (thickness) mm) to be bonded and a bonding pad (Cu foil pattern of size 6×6 mm) of the other body to be bonded on the mounting substrate are bonded, the material for thermal bonding (F) described in the first embodiment is heated at least to the temperature in which the organic compound dispersion medium (A) is melted or softened, then patterned on the bonding face of the size 4×4×0.5 (thickness) mm, the bonding pad (Cu foil pattern of size 6×6 mm) on the mounting substrate or both of the above, then cooled and solidified, and then heat treated under the condition that the body to be bonded (M1) and the body to be bonded (M2) are contacted through the material for thermal bonding (F) so that the body to be bonded (M1) and the body to be bonded (M2) can be bonded by the sintering body formed from the metal fine particles (P) in the material for thermal bonding (F). The condition of the heat treatment is preferably at the temperature of 190 to 250 degrees C. for 20 to 40 minutes, for example, although it depends on the thickness of the patterning.

According to the electronic component bonding method of the sixth embodiment, it is possible to heat or burn at a comparatively low temperature. Since there exist fine voids in the bonded body formed by the sintering of the metal fine particles (P), the rigidity modulus thereof is low, thus enabling to ease up the stress even though the bonding between the materials having different rate of thermal expansion. Furthermore, when Cu fine particles are used for the metal fine particles (P) for example, the heat transfer is high so that the heat dissipating of the electronic component is improved.

In case that the patterning is implemented with the use of solder, conventionally it is necessary to mount on the device such as the dispenser device, and apply the solder paste by the device. However, it is not necessary to use a special device in the electronic component bonding method in the sixth embodiment for the patterning on the body to be bonded (M1). In addition, since the high purity metal fine particles (P) can be used which does not contain impurities that the solder paste contains, it is possible to improve the bonding strength and electrical conductivity.

[VII] Electronic Component Bonding Method of the Seventh Embodiment

The electronic component bonding method of the seventh embodiment of the invention is a electronic component bonding method comprising: adding an organic solvent or aquatic solvent to the material for thermal bonding described in the first embodiment to melt or soften the organic compound dispersion medium (A), then patterning on any one of a surface of a body to be bonded (M1) and a surface of another body to be bonded (M2), or on both surfaces thereof; vaporizing the solvent to be solidified; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding.

As the organic solvent and the aquatic solvent, the same organic solvent and the aquatic solvent as described in the fifth embodiment can be used.

In the case of the seventh embodiment, as in the same manner as the sixth embodiment, the material for thermal bonding (F) is patterned, then cooled and solidified. Before or after the body to be bonded (M1) is contacted with the body to be bonded (M2) through the material for thermal bonding (F), it is preferable that the liquid state organic compound (T) having viscosity is applied on the contact face of the above solidified matter in order to stable the contact state so as to prevent the misalignment or the like.

The application method of the above described liquid state organic compound (T) is the same as described in the sixth embodiment. Those applications are not necessarily implemented on the whole face of the solidified material for thermal bonding, but a part of the application on the surface may be all right if the prevention effect of the misalignment is obtained. According to the employment of the above described fixing means, the bonding between the body (M1) to be bonded and the body (M2) to be bonded can be surely implemented. As the liquid state organic compound (T), the organic compound as exemplified in the sixth embodiment can be used.

A preferable practical example of the electronic component bonding method of the seventh embodiment is exemplified, however, the bonding method of the seventh embodiment is not limited to the following practical example.

In case that the body (size 4×4×0.5 (thickness) mm) to be bonded and a bonding pad (Cu foil pattern of size 6×6 mm) of the other body to be bonded on the mounting substrate are bonded, the material for thermal bonding (F) described in the first embodiment is dispersed in the organic compound dispersion medium (A) and solvent, then patterned as the paste like matter on the bonding face of the size 4×4×0.5 (thickness) mm, the bonding pad (Cu foil pattern of size 6×6 mm) on the mounting substrate or both of the above, then the solvent is vaporized and dried, and then heat treated under the condition that the body to be bonded (M1) and the body to be bonded (M2) are contacted through the material for thermal bonding (F) so that the body to be bonded (M1) and the body to be bonded (M2) can be bonded by the sintering body formed from the metal fine particles (P) in the material for thermal bonding (F). The condition of the heat treatment is preferably at the temperature of 190 to 250 degrees C. for 20 to 40 minutes, for example, although it depends on the thickness of the patterning.

According to the electronic component bonding method of the seventh embodiment, in the same manner as in the case of the sixth embodiment, it is possible to heat or burn at a comparatively low temperature. Since there exist fine voids in the bonded body formed by the sintering of the metal fine particles (P), the rigidity modulus thereof is low, thus enabling to ease up the stress even though the bonding between the materials having different rate of thermal expansion. Furthermore, when Cu fine particles are used for the metal fine particles (P) for example, the heat transfer is high so that the heat dissipating of the electronic component is improved.

The patterning in the electronic component bonding method of the seventh embodiment is the same as described in the sixth embodiment, in addition, since the high purity metal fine particles (P) can be used which does not contain impurities that the solder paste contains, it is possible to improve the bonding strength and electrical conductivity.

[VIII] Electronic Component Bonding Method of the Eighth Embodiment

The electronic component bonding method of the eighth embodiment of the invention is a electronic component bonding method comprising: placing the patterned shaped matter comprising the material for thermal bonding described in the first embodiment on any one of a surface of a body to be bonded (M1) and a surface of another body to be bonded (M2), wherein the surface comprises at least a metal member, semiconductor member or ceramics material, or on both surfaces thereof; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding. It is possible in the electronic component bonding method of the eighth embodiment that when the previously patterned shaped matter is mounted on the body (M1) to be bonded or the like, it is possible to further place the coating described in the fourth, fifth embodiment of the invention on one face or both faces of the body (M1) to be bonded or the like in such manner as holding therebetween.

In case of the eighth embodiment, before or after the previously patterned shaped matter comprising the material for thermal bonding (F) is mounted on one or both surfaces of the body to be bonded (M1) and the body to be bonded (M2), it is preferable that the liquid state organic compound (T) having viscosity is applied on the contact face of the above solidified matter in order to stable the contact state between the body to be bonded (M1) and the body to be bonded (M2) through the patterned shaped matter so as to prevent the misalignment or the like.

The application method of the above described liquid state organic compound (T) is the same as described in the sixth embodiment. Those applications are not necessarily implemented on the whole face of the solidified material for thermal bonding, but a part of the application on the surface may be all right if the prevention effect of the misalignment is obtained. According to the employment of the above described fixing means, the bonding between the body (M1) to be bonded and the body (M2) to be bonded can be surely implemented. As the above described liquid state organic compound (T) having viscosity, the organic compound exemplified in the sixth embodiment can be used.

A preferable practical example of the electronic component bonding method of the eighth embodiment is exemplified hereunder, however, the bonding method of the eighth embodiment is not limited to the following practical example.

In case that the body (size 4×4×0.5 (thickness) mm) to be bonded and a bonding pad (Cu foil pattern of size 6×6 mm) of the other body to be bonded on the mounting substrate are bonded, the material for thermal bonding (F) which is patterned to the size 5×5×0.5 (thickness) mm is prepared. The material for thermal bonding (F) is placed on the bonding pad, then the body to be bonded is placed on the material for thermal bonding (F), and a jig (Teflon resin frame) is placed so as not to be misaligned. The above described patterned material for thermal bonding (F) is for example heat burned at a relatively low temperature of about 200 degrees C. in the furnace under non-oxidizing gas atmosphere, if necessary, so as to be able to form the bonded body. The condition of the heat treatment is preferably at the temperature of 190 to 250 degrees C. for 20 to 40 minutes, although it depends on the thickness of the patterning.

Thus obtained bonded body has an excellent electrical conductivity, and the electrical resistance thereof is 1.0 Ωcm or smaller, for example, about $1.0 \times 10^{-5}$ Ωcm to $1.0 \times 10^{-3}$ Ωcm can be attained. Furthermore, the above described bonded body is remarkably excellent in bondability.

When a patterned shaped matter is used as the material for thermal bonding (F) of the invention, the storage and movement thereof becomes easy. In addition, it is possible to place the above described shaped matter on the body to be bonded by hand. No specific supply device is necessary when placed on the substrate or the like for the purpose of the usage, thus enabling to simplify.

In the electronic component bonding method of the eighth embodiment, in the same manner as in the case of the sixth embodiment, it is possible to heat or burn at a comparatively low temperature. Since there exist fine voids in the bonded body formed by the sintering of the metal fine particles (P), the rigidity modulus thereof is low, thus enabling to ease up the stress even though the bonding between the materials having different rate of thermal expansion. Furthermore, when Cu fine particles are used for the metal fine particles (P) for example, the heat transfer is high so that the heat dissipating of the electronic component is improved.

In the material for thermal bonding (F) used in the electronic component bonding method of the eighth embodiment, since the high purity metal fine particles (P) can be used which does not contain impurities that the solder paste contains, it is possible to improve the bonding strength and electrical conductivity.

EXAMPLES

Then, the present invention was explained in detail by the examples. However, the present invention was not limited to the following examples.

Example 1

The material for thermal bonding which contained Cu fine particles was manufactured. The material for thermal bonding was placed between an aluminum substrate and a silicon tip, and heated to sinter the Cu fine particles contained in the material for thermal bonding so that the aluminum substrate and the silicon tip were bonded. The bonding strength thereof was evaluated.

(1) Manufacturing of the material for thermal bonding 30 mass % of erythritol aqueous solution 50 g in which the erythritol was dissolved in the water and the Cu fine particles 50 g having mean primary particle diameter of 50 nm were mixed to prepare a paste-like matter, and was filled in the metal mold with a disintegrable plurality of compartments (the size of one compartment: vertical size×lateral size× depth=5×5×0.5 mm), then the fluid was slowly vaporized at the temperature of 80 degrees C., and taken out of the mold thus obtaining the patterned shaped matter having 5×5×0.15 mm.

(2) Bonding Electronic Component

An aluminum substrate (manufactured by Denki Kagaku Kogyou k. k., the product name: HITT PLATE K-1 in which an insulating layer having the thickness of 0.075 mm was formed on the aluminum plate having the thickness of 1.5 mm, and then a Cu foil for a circuit having thickness of 0.038 mm was further formed in laminated manner on the insulating layer) was used, and the Cu foil was patterned with etching to prepare a pad. The patterned shaped matter (5×5×0.15 mm) obtained in the above (1) was placed on the pad, and the silicon chip (spattering treatment Ti/Au=35/150 nm) having 4×4×0.35 mm (thickness) was arranged further on the patterned shaped matter in such manner that the spattering treatment face and the fine piece of the material for thermal bonding were contacted.

The above was heated at the temperature of 300 degrees C. for 10 minutes while the pressure of 0.3 MPa was applied on the silicon chip by the flip tip bonder, thus the silicon tip was mounted on the aluminum substrate.

(3) Evaluation of the Bonding Strength

The bonding strength of thus prepared sample with the silicon mounted was measured with the die share examination, and the strength more than 25 MPa was confirmed.

Example 2

In the same manner as Example 1, the aluminum substrate and the silicon chip were bonded with the use of the material for thermal bonding, and the bonding strength was evaluated.

(1) Manufacturing of the Material for Thermal Bonding 30 mass % of erythritol aqueous solution 50 g in which the erythritol was dissolved in the water, the Cu fine particles 45 g having mean primary particle diameter of 50 nm, and the Cu fine particles 5 g having mean particle diameter of 10 μm were mixed to prepare a paste-like matter, and was filled in the metal mold with a disintegrable plurality of compartments (the size of one compartment: vertical size×lateral size× depth=5×5×0.5 mm), then the fluid was slowly vaporized at the temperature of 80 degrees C., and taken out of the mold thus obtaining the patterned shaped matter having 5×5×0.15 mm.

(2) Bonding Electronic Component

The pad was prepared with the use of the same aluminum substrate as Example 1. The patterned shaped matter (5×5× 0.15 mm) obtained in the above (1) was placed on the pad, and the silicon chip (spattering treatment Ti/Au=35/150 nm) having 4×4×0.35 mm (thickness) was arranged further on the patterned shaped matter in such manner that the spattering treatment face and the fine piece of the material for thermal bonding were contacted.

The above was heated and the pressure was applied on the silicon chip by the flip tip bonder under the same condition as described in Example 1, to vaporize the erythritol in the patterned shaped matter and to sinter the Cu fine particles, thus the silicon tip was mounted on the aluminum substrate.

(3) Evaluation of the Bonding Strength

The bonding strength of thus prepared sample with the silicon chip mounted was measured with the die share examination, and the strength more than 25 MPa was confirmed.

Example 3

In the same manner as Example 1, the aluminum substrate and the silicon chip were bonded with the use of the material for thermal bonding, and the bonding strength was evaluated.

(1) Manufacturing of the Material for Thermal Bonding

Powder body in which erythritol powder 15 g and the Cu fine particles 50 g having mean primary particle diameter of 50 nm were uniformly mixed was filled in the metal mold with a disintegrable plurality of compartments (the size of one compartment: vertical size×lateral size×depth=5×5×0.3 mm), then heated at the temperature of 135 degrees C., and the pressure of 0.2 MPa was applied, thus obtaining the patterned shaped matter having 5×5×0.15 mm.

(2) Bonding Electronic Component

The pad was prepared with the use of the same aluminum substrate as Example 1. The patterned shaped matter (5×5× 0.15 mm) obtained in the above (1) was placed on the pad, and the silicon chip (spattering treatment Ti/Au=35/150 nm) having 4×4×0.35 mm (thickness) was arranged further on the patterned shaped matter in such manner that the spattering treatment face and the fine piece of the material for thermal bonding were contacted.

The above was heated and the pressure was applied on the silicon chip by the flip tip bonder under the same condition as described in Example 1, to vaporize the erythritol in the patterned shaped matter and at the same time to sinter the Cu fine particles, thus the silicon tip was mounted on the aluminum substrate.

(3) Evaluation of the Bonding Strength

The bonding strength of the obtained sample with the silicon chip mounted was measured with the die share examination, and the strength more than 25 MPa was confirmed.

Example 4

The aluminum substrate and the silicon chip were bonded with the use of the coating for thermal bonding obtained from the material for thermal bonding, and the bonding strength was evaluated.

(1) Manufacturing of the Material for Thermal Bonding 30 mass % of erythritol aqueous solution 50 g in which the erythritol was dissolved in the water, the Cu fine particles 45 g having mean primary particle diameter of 50 nm, and the Cu fine particles 5 g having mean particle diameter of 10 μm were mixed to prepare a paste-like matter, and was filled in the metal mold with a disintegrable plurality of compartments (the size of one compartment: vertical size×lateral size× depth=5×5×0.5 mm), then the fluid was slowly vaporized at the temperature of 80 degrees C., and taken out of the mold thus obtaining the patterned shaped matter having 5×5×0.15 mm.

(2) Bonding Electronic Component

The obtained fine piece for the thermal bonding was dispersed in the water to prepare paste-like matter. The paste-like matter was coated on the spattering face of the silicon chip (spattering treatment Ti/Au=35/150 nm) having 4×4×0.35 (thickness) mm with the thickness of 0.5 mm, and dried at the temperature of 80 degrees C.

The pad was prepared in the same manner with the use of the same aluminum substrate as Example 1. The pad and the silicon chip were arranged in the manner that the pad faces the coating for the thermal bonding coated on the spattering treatment face.

The above was heated and the pressure was applied on the silicon chip by the flip tip bonder in the same manner as described in Example 1, to vaporize the erythritol in the patterned shaped matter and to sinter the Cu fine particles, thus the silicon tip was mounted on the aluminum substrate.

(3) Evaluation of the Bonding Strength

The bonding strength of obtained sample with the silicon chip mounted was confirmed with the die share examination to have more than 25 MPa.

Example 5

The material for thermal bonding which contains Cu fine particles was manufactured. The material for thermal bonding was placed between an aluminum substrate and a silicon tip, and heated to sinter the Cu fine particles contained in the material for thermal bonding so that the aluminum substrate and the silicon tip were bonded. The bonding strength thereof was evaluated.

(1) Manufacturing of the Material for Thermal Bonding

The paste-like matter in which xylitol 10.5 g, diethylene glycol 4.5 g, and 50 g of Cu fine particles having mean primary particle diameter of 50 nm were mixed at a temperature of 95 degrees C. or more was cooled, thus obtaining the solid material for thermal bonding.

(2) Bonding Electronic Component

An aluminum substrate (manufactured by Denki Kagaku Kogyou k. k., the product name: HITT PLATE K-1 in which an insulating layer having the thickness of 0.075 mm was formed on the aluminum plate having the thickness of 1.5 mm, and then a Cu foil for a circuit having thickness of 0.038 mm was further formed in laminated manner on the insulating layer) was used, and the Cu foil was patterned with etching to prepare a pad. The material for thermal bonding, which was heated at the temperature of 95 degrees C. to be melted state, was coated (about 0.3 mm thickness) with the brush on the pad, then cooled to the room temperature, thus solidified. The silicon chip (spattering treatment Ti/Au=35/150 nm) having 4×4×0.35 (thickness) mm was arranged further on the above described material for thermal bonding in such manner that the spattering treatment face and the fine piece of the material for thermal bonding were contacted.

The above was heated at the temperature of 300 degrees C. for 10 minutes while the pressure of 0.1 MPa was applied on the silicon chip by the flip tip bonder, thus the silicon tip was mounted on the aluminum substrate.

(3) Evaluation of the Bonding Strength

The bonding strength of thus prepared sample with the silicon mounted was measured with the die share examination, and the strength more than 25 MPa was confirmed.

Example 6

In the same manner as Example 1, the aluminum substrate and the silicon chip were bonded with the use of the coating material for thermal bonding, and the bonding strength was evaluated.

(1) Manufacturing of the Coating Material for Thermal Bonding

30 Mass % erythritol aqueous solution 50 g and 50 g of Cu fine particles having mean primary particle diameter of 50 nm were mixed to obtain the softened state coating material for thermal bonding.

(2) Bonding Electronic Component

The above coating material for thermal bonding was coated on the spattering face of the silicon chip (spattering treatment Ti/Au=35/150 nm) having 4×4×0.35 (thickness) mm with the thickness of 0.15 mm, and the fluid was vaporized and dried at the temperature of 80 degrees C.

The pad was prepared in the same manner with the use of the same aluminum substrate as Example 1. The pad and the silicon chip were arranged in the manner that the pad faces the coating for the thermal bonding coated on the spattering treatment face.

The above was heated and the pressure was applied on the silicon chip by the flip tip bonder in the same manner as described in Example 1, thus the silicon tip was mounted on the aluminum substrate.

(3) Evaluation of the Bonding Strength

The bonding strength of obtained sample with the silicon chip mounted was confirmed with the die share examination to have more than 25 MPa.

What is claimed is:

1. A material for thermal bonding for bonding between same members or different members selected from metal members, semiconductor members, and ceramics members, in which copper fine particles (P) are dispersed in an organic compound dispersion medium (A), melted or softened through heating at a temperature higher than 30 degrees C., wherein 60 mass % or more of the organic compound dispersion medium (A) comprises one, two or more types of a polyol (A1) having a melting point or softening point of 30 degrees C. or higher and having two or more hydroxyl groups in the molecule, and the copper fine particles (P) have sinterability and comprise 80 mass % or more of copper fine particles (P1) that have a mean particle diameter of primary particle within a range from 5 to 200 nm, and 20 to 5 mass % of copper fine particles (P2) that have a mean particle diameter of primary particle within a range between 1 and 20 μm (a total of mass % is 100 mass %).

2. The material for thermal bonding according to claim 1, wherein at least the polyol (A1) and one, two or more types of polyol (A2) having a melting point or softening point of below 30 degrees C. and having two or more hydroxyl groups in the molecule are contained in the organic compound dispersion medium (A), a ratio of the polyol (A2) to a total of the polyol (A1) and the polyol (A2) is up to 40 mass %.

3. The material for thermal bonding according to claim 1, wherein the material for thermal bonding comprises 10 to 70 mass % of the organic compound dispersion medium (A) and 90 to 30 mass % of the copper fine particles (P) (a total of mass % is 100 mass %).

4. The material for thermal bonding according to claim 1, wherein the material for thermal bonding is formed in a patterned shape including at least one of a flattened fine piece shape, a scale fine piece shape, a tablet shape, a particle shape, a sheet shape, and a lump shape.

5. A coating material for thermal bonding obtained by heat-melting or softening the material for thermal bonding according to claim 1 or dissolving or softening the material in through adding an organic solvent or an aquatic solvent.

6. A coating obtained by coating the material for thermal bonding according to claim 1 on a terminal or a surface of an electrode of an electronic component, or a surface of a circuit of a substrate.

7. A coating obtained by heating the material for thermal bonding according to claim 1 at a temperature of 30 degrees C. or higher to melt or soften the organic compound dispersion medium (A), coating the material for thermal bonding on a terminal or a surface of an electrode of an electronic component, or a surface of a circuit of a substrate, and cooling the above to a temperature lower than a melting or softening temperature.

8. A coating obtained by adding an organic solvent or an aquatic solvent to the material for thermal bonding according to claim 1 to be melted or softened, coating the material for thermal bonding on a terminal or a surface of an electrode of an electronic component, or a surface of a circuit of a substrate, and causing the solvent to be vaporized, thus solidified.

9. An electronic component bonding method comprising: heating the material for thermal bonding according to claim 1 to a temperature in which the organic compound dispersion medium (A) is melted or softened to be patterned on any one of a surface of a body to be bonded (M1) and a surface of another body to be bonded (M2), or on both surfaces thereof; cooling to a temperature lower than a melting or softening temperature to be solidified; and heat treating the body to be bonded (M1) and the body to be bonded (M2) contacted through the material for thermal bonding to bond the body to be bonded (M1) and the body to be bonded (M2) with a sintering body formed from the copper fine particles (P) in the material for thermal bonding.

10. An electronic component bonding method comprising: adding an organic solvent or aquatic solvent to the material for thermal bonding according to claim 1 to melt or soften the organic compound dispersion medium (A), then patterning on any one of a surface of a body to be bonded (M1) and a surface of another body to be bonded (M2), or on both surfaces thereof; vaporizing the solvent to be solidified; and heat treating the body to be bonded (M1) and the body to be bonded (M2) contacted through the material for thermal bonding to bond the body to be bonded (M1) and the body to be bonded (M2) with a sintering body formed from the copper fine particles (P) in the material for thermal bonding.

11. An electronic component bonding method comprising: placing the material for thermal bonding according to claim 4 on any one of a surface of a body to be bonded (M1) and a surface of another body to be bonded (M2), wherein the surface comprises at least a metal member, semiconductor member or ceramics material, or on both surfaces thereof; and heat treating the body to be bonded (M1) and the body to be bonded (M2) contacted through the material for thermal bonding to bond the body to be bonded (M1) and the body to be bonded (M2) with a sintering body formed from the metal fine particles (P) in the material for thermal bonding.

* * * * *